United States Patent [19]
Song

[11] Patent Number: 5,689,204
[45] Date of Patent: Nov. 18, 1997

[54] CLIPPER CIRCUIT FOR CLIPPING AN UPPER OR LOWER PORTION OF A UNI-DIRECTIONAL SINUSOIDAL VOLTAGE SIGNAL

[75] Inventor: Ui Ho Song, Seoul, Rep. of Korea

[73] Assignee: Samsung Electro-Mechanics Co., Ltd., Kyungki-do, Rep. of Korea

[21] Appl. No.: 580,415

[22] Filed: Dec. 28, 1995

[30] Foreign Application Priority Data

Dec. 30, 1994 [KR] Rep. of Korea ............. U94-38307

[51] Int. Cl.[6] ............................................ H03K 5/08
[52] U.S. Cl. ........................................ 326/325; 327/309
[58] Field of Search .................... 327/309, 312, 327/313, 314, 320, 321, 325, 326, 330, 194, 421, 104

[56] References Cited

U.S. PATENT DOCUMENTS

| | | | |
|---|---|---|---|
| 2,853,630 | 9/1958 | Lane et al. | 327/314 |
| 2,927,223 | 3/1960 | Meirowitz | 327/325 |
| 3,041,535 | 6/1962 | Cohran | 327/320 |
| 3,241,069 | 3/1966 | Garfield | 327/325 |
| 3,283,259 | 11/1966 | Banks | 327/320 |
| 3,440,557 | 4/1969 | Sundeen, Jr. | 327/325 |
| 4,138,612 | 2/1979 | Schlesinger | 327/325 |
| 4,322,767 | 3/1982 | El Hamamsy et al. | 327/421 |
| 4,489,312 | 12/1984 | Yoshizaki | 340/514 |
| 4,748,533 | 5/1988 | Hertrich et al. | 327/421 |
| 4,858,055 | 8/1989 | Okitaka | 327/313 |
| 5,206,548 | 4/1993 | Takahashi et al. | 327/309 |

FOREIGN PATENT DOCUMENTS 403117113  5/1991  Japan ............. 327/434

Primary Examiner—Timothy P. Callahan
Assistant Examiner—My-Trang Nu Ton
Attorney, Agent, or Firm—Lowe, Price, LeBlanc & Becker

[57] ABSTRACT

A clipper circuit for clipping an upper portion and/or lower portion of a uni-directional sinusoidal voltage signal. The clipper circuit comprises a uni-directional buffer amplifier biased to either a (+) or (−) voltage for taking a sinusoidal voltage signal with only a (+) or (−) band value as an input voltage signal, a first Zener diode whose anode is connected to an output port of said uni-directional buffer amplifier and cathode is connected to a predetermined voltage source for clipping the lower portion of the input voltage signal as a predetermined setting value, and a second Zener diode whose cathode is connected to the output port of the uni-directional buffer amplifier and whose anode is grounded for clipping the upper portion of the input voltage signal as a predetermined setting value.

6 Claims, 2 Drawing Sheets

CLIPPER CIRCUIT FOR CLIPPING AN UPPER OR LOWER PORTION OF A UNI-DIRECTIONAL SINUSOIDAL VOLTAGE SIGNAL

BACKGROUND OF THE INVENTION

1. Field of the Invention

This invention relates to a clipper circuit for limiting an instantaneous value of an output wave to below a predetermined value, and more particularly to a clipper circuit for clipping an upper portion and/or lower portion of a voltage signal having only a positive band above 0V or a negative band below 0V.

2. Description of the Prior Art

In general, a clipper circuit is a circuit which cuts off a portion above a predetermined level and/or below a predetermined level of a voltage signal to be inputted, using a nonlinear element such as a diode.

Such a clipper circuit has been used in a variety of ways in the electronic circuit field. For example, the clipper circuit has been frequently adapted when a stable voltage is required to be supplied to an associated circuit in a SMPS power supply circuit, the noise included in a received voice signal in a field of the communication should be eliminated, or a rectangular waveform is formed using a received voice signal.

Referring to FIG. 1 which shows a conventional voltage clipper circuit, the clipper circuit comprises bi-directional buffer amplifier BF1 for adjusting an output of an alternating voltage to be inputted from an alternating power supply Vs, a resistor R1 connected to an output port of the bi-directional buffer amplifier BF1 for controlling an amplitude of an output voltage, and first and second Zener diodes ZD1, ZD2 connected in series to the resistor R1 for clipping an upper portion and a lower portion of the alternating voltage via the resistor R1 to a predetermined voltage level.

As shown in FIG. 1, a noninverting port (+) of the buffer amplifier BF1 is supplied with positive voltage, while an inverting port (−) of the buffer amplifier BF1 is supplied with negative voltage. A buffer amplifier having both of the noninverting port and the inverting port is referred as a bi-directional buffer amplifier. The first and second Zener diodes ZD1, ZD2 are connected in series with their anode port opposite another.

Now, the operation of the conventional clipper circuit constructed as above will be explained in conjunction with FIG. 1 and 2.

First, (+)12V and (−)12V as a driving voltage from a direct power supply are applied to the bi-directional buffer amplifier BF1 of FIG. 1, and Zener voltages of the first and second Zener diodes ZD1, ZD2 are set to 3V and −2V, respectively.

Referring to FIG. 1, an input voltage Vs of the clipper circuit is a sinusoidal wave alternating within the range of +12V to −12V via the buffer amplifier BF1. An output voltage Vo of the clipper circuit appears like the input voltage, but because the first Zener diode ZD1 is conducted as soon as the output voltage exceeds the Zener voltage, 3V, of the first Zener diode ZD1, the output voltage after the conduction of the first Zener diode ZD1 appears clipped as the Zener voltage 3V of the first Zener diode ZD1, as shown in FIG. 2. At this time, when the first Zener diode ZD1 is conducted, the second Zener diode ZD1 is in turn conducted to be operated just like a buffer.

Then, when the input voltage Vs drops below 3V according to the property of the sinusoidal wave, the first and second Zener diodes ZD1, ZD2 are turned off so that the output voltage Vo appears as the input voltage Vs.

In succession, when the input voltage becomes the Zener voltage −2V of the second Zener diode ZD2, the second Zener diode ZD2 is conducted and, in turn, the first Zener diode ZD1 is conducted. Accordingly, the output voltage Vo appears clipped as the Zener voltage −2V of the second Zener diode ZD2 as shown in FIG. 2 until the input voltage Vs exceeds −2V (in the absolute value).

In other words, the output voltage Vo appears with its upper limit value and lower limit value clipped to correspond to the Zener voltage 3V, −2V of the Zener diode ZD1, ZD2, respectively.

However, though such a conventional clipper circuit clips the parts of the upper portion and lower portion of the sinusoidal voltage signal with both a (+) and (−) band value as the predetermined voltage level, it is not able to clip the parts of the upper portion and lower portion of the sinusoidal voltage signal with only a (+) or (−) band value.

Accordingly, when it is required that the sinusoidal voltage signal with only a (+) or (−) band value should be clipped, a conventional clipper circuit has the disadvantage that the circuit configuration becomes complicated and its manufacturing cost increases since several basic clipper circuits should be connected to each other to obtain a desired clipped signal.

SUMMARY OF THE INVENTION

In view of the foregoing problems, it is an object of this invention to provide a clipper circuit for clipping the upper portion and lower portion of the sinusoidal voltage signal with only a (+) or (−) band value as a predetermined voltage level by a simple circuit.

To accomplish the above object, in accordance with an aspect of this invention, there is provided clipper circuit, comprising:

a uni-directional buffer amplifier biased to either a (+) or (−) voltage for taking a sinusoidal voltage signal with only a (+) or (−) band value as an input voltage signal;

a first Zener diode whose anode is connected to an output stage of the uni-directional buffer amplifier and whose cathode is connected to a predetermined voltage source for clipping the lower portion of the input voltage signal as a predetermined setting value; and a second Zener diode whose cathode is connected to the output stage of the uni-directional buffer amplifier and whose anode is grounded for clipping the upper portion of the input voltage signal as a predetermined setting value.

Advantageously, the voltage clipper circuit according to the invention further comprises another uni-directional buffer amplifier for taking a voltage signal clipped by the first and second Zener diodes as an input voltage signal.

BRIEF DESCRIPTION OF THE DRAWINGS

The clipper circuit of this invention is explained in detail below by way of the preferred embodiment and with reference to the accompanying drawing in which.

DETAILED DESCRIPTION OF THE PREFERRED EMBODIMENT

Figure 1:
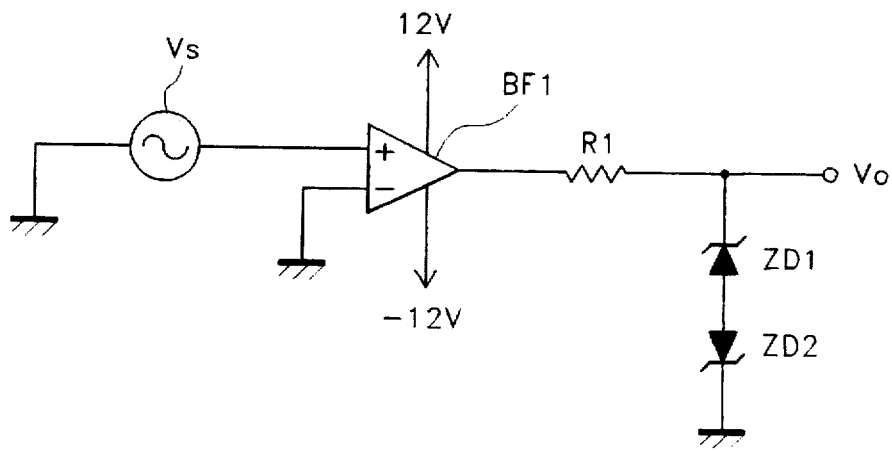
FIG. 1 shows a conventional clipper circuit diagram.
Figure 2:
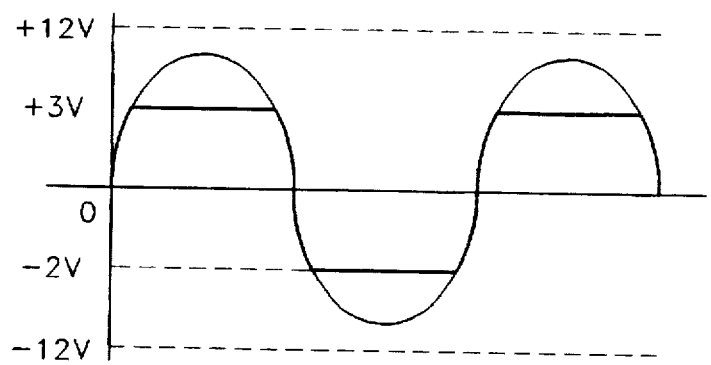
FIG. 2 shows a waveform for explaining the operation of the clipper circuit of FIG. 1.
Figure 3:
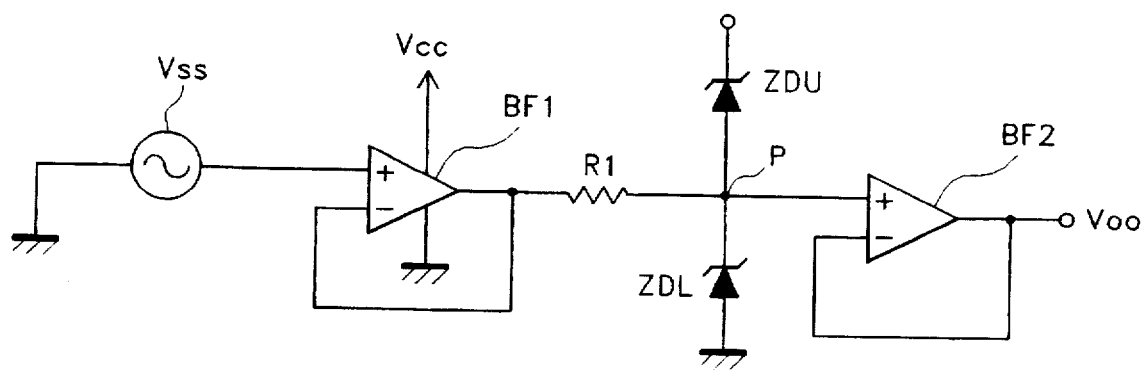
FIG. 3 shows a clipper circuit diagram of an embodiment according to this invention.

FIG. 3 shows a clipper circuit of an embodiment according to this invention. Referring to FIG. 3, the clipper circuit of this invention comprises an uni-directional buffer amplifier BF1 operated by $V_{cc}$ with positive polarity for buffering an input voltage $V_{SS}$, a resistor R1 connected to an output port of the uni-directional buffer amplifier BF1 for limiting an output current of the uni-directional buffer amplifier BF1, and first and second Zener diodes ZDU, ZDL connected to an output port of the resistor R1 for clipping upper and lower portions of a uni-directional sinusoidal voltage signal passing the resistor R1 as a predetermined voltage level.

Figure 4A:
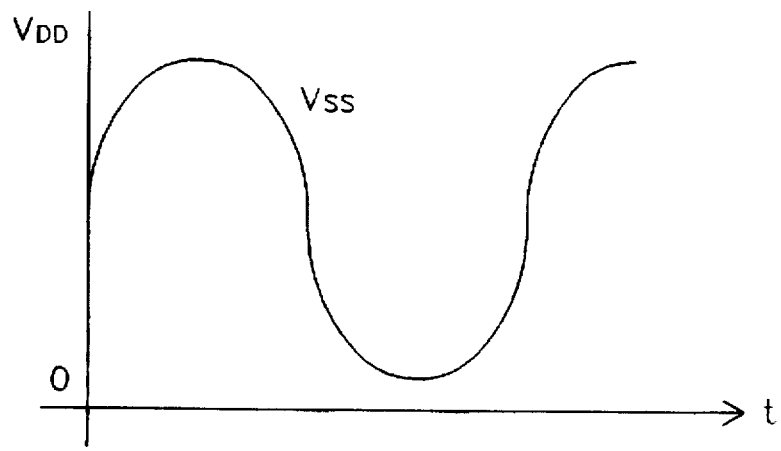
FIGS. 4A and 4B shows waveforms of input and output voltages of the clipper circuit of FIG. 3.
Figure 4B:
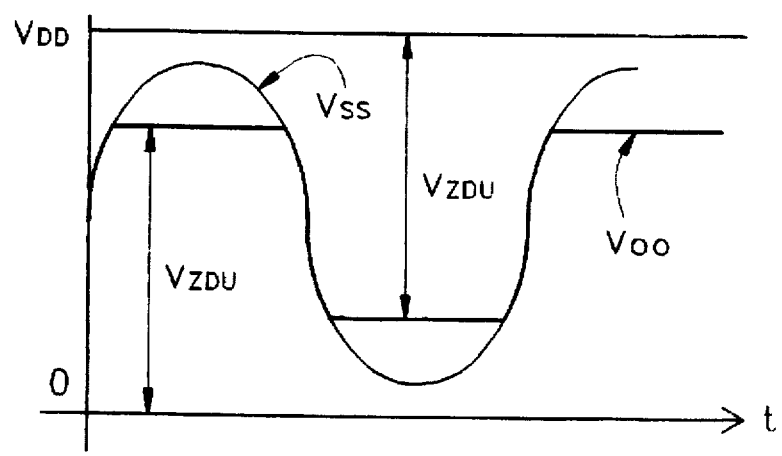

Now, the operation of the clipper circuit of this invention configurated as above is explained in detail in conjunction with FIGS. 3 and 4.

Referring to FIG. 3, the input voltage $V_{SS}$ with an amplitude within the (+) band is inputted as an input signal to the uni-directional buffer amplifier BF1 which is supplied with $V_{cc}$ being DC voltage as a driving voltage. A waveform of the input voltage $V_{SS}$ to be inputted to the uni-directional buffer amplifier BF1 is shown in FIG. 4A.

The first Zener diode ZDU of FIG. 3 is a diode for clipping the lower portion of the sinusoidal input voltage signal $V_{SS}$ as a predetermined setting level. The second Zener diode ZDL of FIG. 3 is a diode for clipping the upper portion of the sinusoidal input voltage signal $V_{SS}$ as another predetermined setting level. The anode port of the second Zener diode ZDL is grounded. The cathode port of the second Zener diode ZDL is connected in common to the resistor R1 and the anode port of the first Zener diode ZDU. In addition, the cathode port of the first Zener diode ZDU is connected to the voltage source $V_{DD}$.

Another uni-directional buffer amplifier BF2 as an output buffer amplifier to output an output voltage $V_{oo}$ is connected to a common junction point of the first and second Zener diodes ZDU, ZDL. Here, the voltage source VDD Of the first Zener diode ZDU is set to be less than the sum ($V_{ZDU}+V_{ZDL}$) of the Zener voltages of the first and second Zener diodes ZDU, ZDL. In other word, $V_{DD}$ is set to satisfy the following conditions:

$$V_{DD}>0, V_{DD}<V_{ZDU}+V_{ZDL}$$

Here, $V_{ZDU}$ is the Zener voltage of the first Zener diode ZDU, $V_{ZDL}$ being the Zener voltage of the second Zener diode ZDL.

In addition, it is assumed that the input voltage $V_{SS}$ to be inputted through the uni-directional buffer amplifier BF1 is 18V, the voltage $V_{DD}$ to be applied to the first Zener diode ZDU is 20V, and the Zener voltage of the first and second Zener diodes ZD1, ZDL are 15V respectively.

When the input voltage $V_{SS}$, as shown in FIG. 4A, to be inputted through the uni-directional buffer amplifier BF1 becomes more the Zener voltage $V_{ZDL}$ of the second Zener diode ZDL, that is, when $V_{SS}>V_{ZDL}$, the second Zener diode ZDL is conducted.

Therefore, until the input voltage $V_{SS}$ to be inputted through the uni-directional buffer amplifier BF1 becomes less than the Zener voltage $V_{ZDL}$ of the second Zener diode ZDL, the output voltage $V_{))}$ keeps the second Zener voltage $V_{ZDL}$ of the first Zener diode ZDU ($V_{oo}=V_{ZDL}$).

At this time, when the input voltage $V_{SS}$ to be inputted through the uni-directional buffer amplifier BF1 continues to decrease and becomes less than the value resulted from the subtraction of the Zener voltage $V_{ZDU}$ of the first Zener diode ZDU from the voltage source $V_{DD}$, that is, when $V_{SS}<VDD-V_{ZDU}$, the first Zener diode ZDU is conducted.

Accordingly, the output voltage $V_{oo}$ becomes the value resulted from the substraction of the Zener voltage $V_{ZDU}$ of the first Zener diode ZDU from the voltage source $V_{DD}$ of the first Zener diode ZDU ($V_{oo}=V_{DD}-V_{ZDU}$).

Under such conditions, when the input voltage $V_{SS}$ to be inputted through the uni-directional buffer amplifier BF1 becomes more than the value resulted from the substraction of the Zener voltage $V_{ZDU}$ of the first Zener diode ZDU from the voltage source $V_{DD}$ of the first Zener diode ZDU, that is, when $V_{oo}>V_{DD}-V_{ZDU}$, the output voltage $V_{oo}$ becomes the input voltage $V_{SS}$ ($V_{oo}=V_{SS}$).

In other words, when an inequality relationship $V_{DD}-V_{ZDU}$ $V_{SS}<V_{ZDL}$ is satisfied, the output voltage $V_{oo}$ is equal to the input voltage $V_{SS}$.

As explained hereinbefore, according to the clipper circuit of this invention, two Zener diodes are connected in parallel to the output port of the uni-directional buffer amplifier so that a waveform may be produced to clip the upper and lower portions of the sinusoidal voltage signal with an amplitude within only a (+) or (−) band value.

Though the clipping of the input voltage signal with an amplitude of a (+) band value has been described by way of the embodiment of this invention, it is to be understood that the clipper circuit of this invention is also applicable to the input voltage signal with an amplitude of a (−) band value.

What is claimed is:

1. A clipper circuit comprising:
   a uni-directional buffer amplifier biased to either a (+) or (−) voltage for taking a sinusoidal voltage signal with only a (+) or a (−) band value as an input voltage signal;
   a first Zener diode whose anode is connected to an output port of said uni-directional buffer amplifier and whose cathode is connected to a predetermined voltage source for clipping a lower portion of the input voltage signal as a predetermined setting value; and
   a second Zener diode whose cathode is connected to the output port of the uni-directional buffer amplifier and whose anode is grounded for clipping a upper portion of the input voltage signal as a predetermined setting value.

2. A clipper circuit as set forth in claim 1, further comprising:
   another uni-directional buffer amplifier for buffering a voltage signal clipped by said first and second Zener diodes.

3. A clipper circuit as set forth in claim 1, wherein when the input voltage signal becomes less than the value resulted from the substraction of the Zener voltage of said first Zener diode from voltage source, said first Zener diode clips the input voltage signal as the value resulted from the substraction of the Zener voltage of said first Zener diode from said voltage source.

4. A clipper circuit as set forth in claim 1, wherein when the input voltage signal becomes more than the Zener voltage of said second Zener diode, said second Zener diode clips the input voltage signal as the Zener voltage of said second Zener diode.

5. A clipper circuit according to claim 1, wherein the first and second Zener diodes are connected in parallel to the output port of the uni-directional buffer amplifier.

6. A clipper circuit according to claim 1, further comprising:
   a resistor connected to the output port of the uni-directional buffer amplifier.

* * * * *